US006111902A

United States Patent [19]

Kozlov et al.

[11] Patent Number: 6,111,902

[45] Date of Patent: Aug. 29, 2000

[54] ORGANIC SEMICONDUCTOR LASER

[75] Inventors: Vladimir Kozlov, Plainsboro; Stephen R. Forrest; Paul Burrows, both of Princeton; Vladimir Bulovic, Metuchen, all of N.J.

[73] Assignee: The Trustees of Princeton University, Princeton, N.J.

[21] Appl. No.: 08/859,468

[22] Filed: May 19, 1997

Related U.S. Application Data

[60] Provisional application No. 60/046,061, May 9, 1997.

[51] Int. Cl.[7] .................. H01S 3/16; H01S 3/05

[52] U.S. Cl. .................. 372/39; 372/53; 372/70

[58] Field of Search .................. 428/690, 446; 313/506, 503; 257/40; 372/39, 7, 54, 53, 70, 43, 96

[56] References Cited

U.S. PATENT DOCUMENTS

| | | | |
|---|---|---|---|
| 3,818,371 | 6/1974 | Herz et al. | 372/53 |
| 3,913,033 | 10/1975 | Tuccio | 372/53 |
| 4,395,769 | 7/1983 | Damen et al. | 372/7 |
| 5,237,582 | 8/1993 | Moses | 372/53 |
| 5,307,363 | 4/1994 | Hosokawa et al. | 372/53 |
| 5,329,540 | 7/1994 | Lee et al. | 372/53 |
| 5,343,050 | 8/1994 | Egusa et al. | 257/40 |
| 5,408,710 | 4/1995 | Dodabalapur et al. | 428/690 |
| 5,487,080 | 1/1996 | Mukherjee | 372/69 |
| 5,530,711 | 6/1996 | Scheps | 372/20 |
| 5,557,626 | 9/1996 | Grodzinski et al. | 372/45 |
| 5,578,379 | 11/1996 | Stutzmann et al. | 428/446 |
| 5,701,323 | 12/1997 | Kahr et al. | 372/54 |
| 5,739,545 | 4/1998 | Guha et al. | 257/40 |
| 5,881,089 | 3/1999 | Berggren et al. | 372/96 |

OTHER PUBLICATIONS

Tessler et al, "Lasing from Conjugated–polymer Microcavities", Nature 382, 695 (Aug. 22, 1996).

Hide et al, "Semiconducting Polymers: A New Class of Solid–State Laser Materials", Science 273, 1833 (Sep. 27, 1996).

Hermes et al, "High–efficiency Pyrromethene Doped Solid–State Dye Lasers", Appl. Phys. Lett. 63, 877, (Aug. 16, 1993).

Weiss et al, "Measurement of Optical Gain at 670 nm in an Oxazine–doped Polyimide Planar Waveguide", Applk. Phys. Lett 69, 3653 (Dec. 9, 1996).

Kogelnik et al, "Stimulated Emission in a Periodic Structure", Appl. Phys. Lett 18, 152 (Feb. 15, 1971).

Canva et al "Perylene–and Pyrromethene–Doped Xerogel for a Pulsed Laser", Appl Opt 34, 428 (Jan. 20, 1995).

Schwartz et al, "Conjugated Polymers as Thin Film Solid–State Laser Materials: Photopumped Lasing, Gain–Narrowing and Waveguiding", Materials Research Society 1997 Spring Meeting Abstract H1.1 (Mar. 31, 1997).

Berggren et al, "Organic Light Emitting Microstructures", Materials Research Society 1997 Spring Meeting, Abstract H1.6 (Mar. 31, 1997).

Zenz, et al, "Laser Action in a Poly(Paraphenylene–Type Ladder Polymer", Materials Research Society 1997 Spring Meeting, Abstact H2.1 (Mar. 31, 1997).

McGehee et al, "Distributed Feedback Lasers Made with Semiconducting Conjugated Polymers as the Gain Material", Materials Research Society 1997 Spring Meeting, Abstract H2.2 (Mar. 31, 1997).

Spiegelberg et al, "Gain Dynamics in Conjugated Polymers", Materials Research Society 1997 Spring Meeting, Abstract H2.3 (Mar. 31, 1997).

Rothberg et al, "Status of and Prospects for Organic Electroluminescence", J. Mater Res, 11:3174 (Dec. 1996).

Zang et al, "All–Optical Modulation in Crystalline Organic Semiconductor Waveguides", Appl Phys Lett 60 (2), 189 (Jan. 13, 1992).

Greengram et al, "Semiconductor Physics of Conjugated Polymers", Solid state Physics, 49:1. (1995) (No Month).

*Primary Examiner*—James W. Davie
*Attorney, Agent, or Firm*—Kenyon & Kenyon

[57] ABSTRACT

An optically-pumped laser having a small-molecule thin organic film of DCM doped $Alq_3$. Carrier transport properties of the small-molecule organic materials, combined with a low lasing threshold provide a new generation of diode lasers employing organic thin films. An electrically-pumped variant is also described.

79 Claims, 6 Drawing Sheets

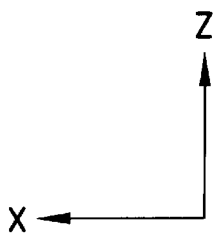
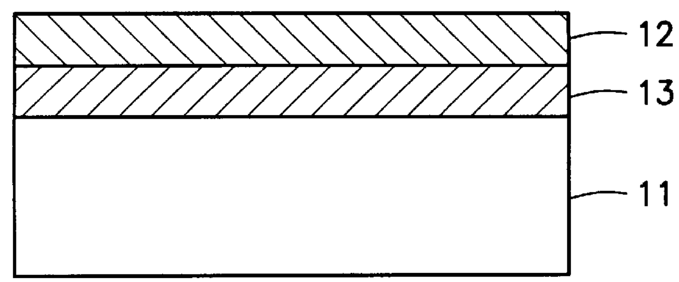
FIG. 6A
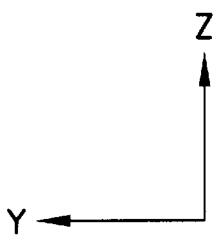
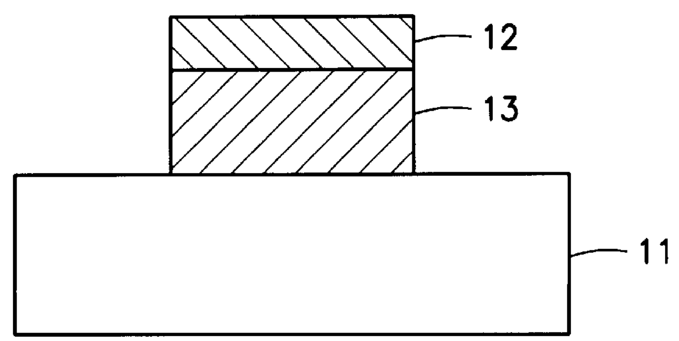
FIG. 6B

ORGANIC SEMICONDUCTOR LASER

RELATED APPLICATIONS

All or part of the present application claims the benefit, under 35 U.S.C. § 119 (e)(2), of U.S. provisional application Ser. No. 60/046,061 filed on May 9, 1997 and entitled ORGANIC SEMICONDUCTOR LASER.

GOVERNMENT RIGHTS

This invention was made with Government support under Contract No. F49620-96-1-0277 awarded by AFOSR. The government has certain rights in this invention.

FIELD OF THE INVENTION

The present invention relates to the field of light emitting devices, in particular, to organic semiconductor lasers.

BACKGROUND INFORMATION

Several recent publications have reported either superluminescence or amplified spontaneous emission in polymeric organic light emitters such as conjugated polymers. (N. Tessier et al., *Nature* 382, 695 (1996); F. Hide et al., *Science* 273, 1833 (1996)). The materials used in those emitters were spin-coated from a solution of the polymer or its chemical precursors. Optically pumped, stimulated emission from organic laser dyes, introduced into inert, spin-coated polymers or gels has been described in the literature. (R. E. Hermes, et al., *Appl. Phys. Lett.* 63, 877 (1993); M. N. Weiss et al., *Appl. Phys. Lett.* 69, 3653 (1996); H. Kogelnik et al., *Appl. Phys. Lett.* 18, 152 (1971); M. Canva et al., *Appl. Opt.*, 34, 428 (1995)).

Recent work has demonstrated gain-narrowed photoluminescence spectra with full widths at half maxima (FWHM) of 40–60 Å in response to a short pulse laser excitation, typically 1 $\mu$J in a 10 ns pulse. (Materials Research Society 1997 Spring Meeting, Abstracts H1.1, H1.6, H2.1, H2.2, H2.3.) Such work is potentially applicable to electrically pumped organic solid state lasers ("plastic lasers"). If realized, such devices could offer low cost and ease of integration of laser sources onto either conventional semiconductor circuitry or lightweight plastic substrates.

Spun-on polymeric materials, however, do not exhibit particularly good thickness uniformity, ability to achieve extremely high materials purity, and ease of integration with other conventional semiconductor fabrication processes.

In the field of organic light emitting devices (OLEDs) for flat panel display applications, small molecule OLEDs currently offer better operating lifetimes by an order of magnitude over their spin-coated, polymeric analogs. (L. J. Rothberg et al., "Status of and Prospects for Organic Electroluminescence", *J. Mater. Res.* 1996, 11:3174; N. C. Greenham et al., "Semiconductor Physics of Conjugated Polymers", *Solid State Physics* 1995, 49:1.)

However, there has been no known demonstration of laser action in a vacuum-deposited organic thin film structure. Furthermore, there is considerable skepticism about the realization of small-molecule organic lasers because of quenching processes which can occur in such materials. Such quenching processes are observed at high carrier densities and lead to decreased photoluminescence quantum efficiency. For example, bimolecular reactions in Alq, films have been found to cause the quantum efficiency of photoluminescence to begin to decrease at incident intensities above $10^{14}$ photons/cm$^2$. (D. Y. Zang et al., *Appl. Phys. Lett.* 60 (2), 189, 1992.)

SUMMARY OF THE INVENTION

The present invention is directed to a small molecule, organic thin film laser with very low threshold lasing. Both optically and electrically pumped embodiments are disclosed.

In contrast to spun-on polymeric materials, vacuum-deposition of small molecular weight organic materials offers the advantages of excellent thickness uniformity, extremely high materials purity, and ease of integration with other conventional semiconductor fabrication processes.

In an exemplary embodiment of the present invention, very low threshold, optically-pumped lasing is achieved in a vacuum-deposited, organic thin film comprising a layer of tris(8-hydroxyquinoline) aluminum ($Alq_3$) doped with DCM laser dyes. A very low lasing threshold is achieved at a pump energy density of 1.5 $\mu$J/cm$^2$ with a 500 psec excitation pulse. Above the threshold, several extremely narrow (i.e., less than 1 Å FWHM), linearly polarized Fabry-Perot modes appear in the output spectrum. The peak output power above the threshold exceeds 30 W from a $3\times10^{-7}$ cm$^2$ output facet, corresponding to a peak power of approximately $10^8$ W/cm$^2$.

Bright red laser emission is clearly visible from the edge of the device. The output laser beam includes several transverse modes which diverge in a direction orthogonal to the surface of the device of the present invention. The emission is strongly linearly polarized, as one would expect for laser emission. No appreciable degradation of laser material occurs after several hours of pulsed operation in a dry nitrogen atmosphere.

The present invention provides a laser device with a small-molecule, vacuum-depositable organic thin film which exhibits a low lasing threshold (1.5 $\mu$J/cm$^2$), high efficiency, narrow linewidth (less than 1 Å) and high peak power (30 W). The pump threshold corresponds to a current density of 10–50 A/cm$^2$ for an electrically pumped laser using such materials.

The ease of processing, low threshold and other characteristics of vacuum-deposited materials opens the door to an entirely new generation of optically and electrically-pumped solid-state lasers using vacuum-deposited organic semiconductors.

The laser of the present invention can be used in a wide variety of applications, including telecommunications, printing, optical downconversion, semiconductor circuit etching, thermal processing (e.g., marking, soldering and welding), spectroscopy, vehicular control and navigation, measurement devices, optical memory devices, displays, scanners, pointers, games and entertainment systems and sensors.

BRIEF DESCRIPTION OF THE DRAWINGS

FIG. 5 shows the polarization of the emission of a device in accordance with the present invention, as a function of the angle between a plane orthogonal to the film surface and the plane of a polarizer.

FIGS. 6A and 6B show further embodiments of optically-pumped laser devices in accordance with the present invention.

DETAILED DESCRIPTION

Figure 1:
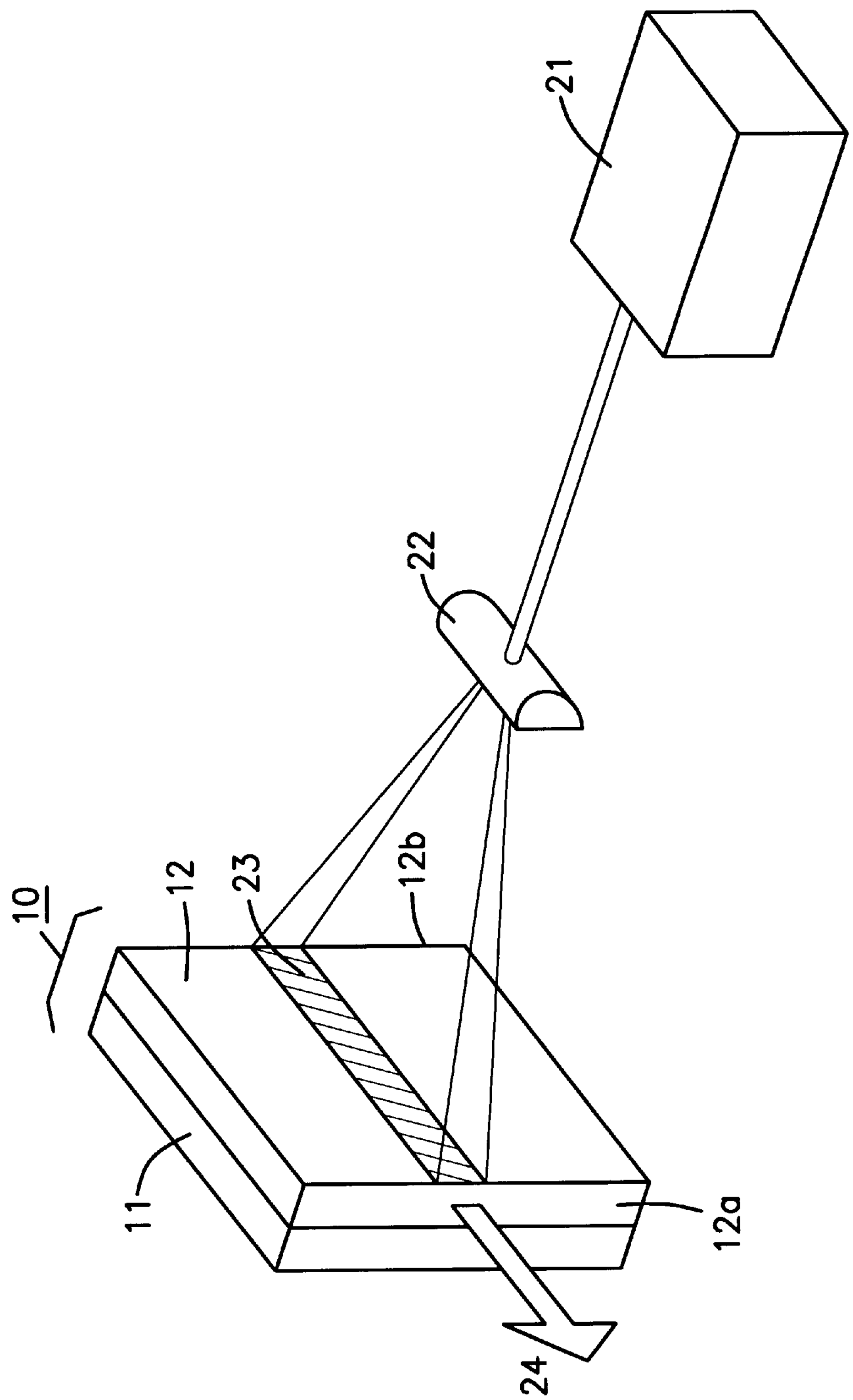
FIG. 1 shows an arrangement including a laser device in accordance with the present invention.

FIG. 1 shows an optically-pumped laser arrangement including an organic film laser 10 in accordance with the present invention. The device of FIG. 1 comprises a small molecule vacuum-depositable, organic film 12 including a layer of tris-(8-hydroxyquinoline) aluminum ($Alq_3$) doped with DCM laser dye. Such a dye is available from Exciton Inc. of Dayton, Ohio.

The device 10 of FIG. 1 exhibits a very low lasing threshold at a pump energy density of 1.5 $\mu$J/$cm^2$ with a 500 psec excitation pulse. Above the lasing threshold, several extremely narrow, i.e., less than 1 Å FWHM, linearly polarized Fabry-Perot modes appear in the output spectrum between 660 nm and 670 nm. The peak output power above the threshold is at, least 30 W from a $3\times10^{-7}$ $cm^2$ output facet.

Doping $Alq_3$ with a red dye such as DCM provides an excellent laser material because the red emission (and optical gain) generated is far away from the absorption edge of the $Alq_3$ host material (at 450 nm). Doping also allows reduction at the density of the optically active DCM molecules (thereby reducing the effective density of states), which lower the threshold and increases the efficiency of the laser.

The concentration of the dopant in the thin film 12 can typically be selected to be less than 10%, by mass, but can be as low as 0.01%. The optimal concentration of DCM, i.e., that concentration which will yield the lowest lasing threshold, is that concentration which will provide sufficient optical gain to overcome the optical losses of the device 10. A low concentration, however, prevents clustering, thereby reducing non-radiative losses. In an exemplary embodiment, a concentration of 1.5% was found to be optimal for a 3 mm long device.

DCM is a good active dopant because it can be vacuum deposited along with the $Alq_3$ and because it has a very high absorbance in the green spectral range, thereby providing for efficient energy transfer from the $Alq_3$ to the DCM molecules Other combinations of host and dopant materials can be used to form the film 12. For example, ALX can be used instead of $Alq_3$ as the host material and coumarin (C6) can be used instead of DCM as the dopant. Any combination of host and dopant materials which-allows for good energy transfer between the host and dopant and in which the host is transparent, or nearly transparent, in the spectral range of the dopant can be used in the optically-pumped embodiment of the present invention.

Although the laser device 10 described thus far is an optically-pumped device, the $Alq_3$/DCM film 12 used in the device 10 has the advantage of being conducive to electrical pumping because $Alq_3$ is an efficient electron transporting material.

The laser device of the present invention can be grown on any substrate to which the organic film will adhere and which has a lower index of refraction (n) than the organic film material. Acceptable substrates include some plastics, glass and silicon coated with $SiO_2$.

In an exemplary embodiment, the device 10 is grown on a substrate such as a glass slide 11 by high vacuum ($5\times10^{-7}$ Torr) co-evaporation of $Alq_3$ and DCM in a molecular ratio of approximately 50:1. This ratio is controlled by independently varying the evaporation rate of each constituent molecule. A 3000 Å thick film of $Alq_3$/DCM, having an optical index of refraction (n) of 1.7, forms a slab optical waveguide with glass (n=1.4) as a cladding layer on one side, and air (n=1) on the other. This slab optical waveguide in conjunction with reflective facets 12*a* and 12*b* of the deposited organic film layer 12 form an optical resonator. Lateral confinement of the optical mode is achieved by gain-guiding induced by the optical pump beam. The thickness of the organic film is selected to be large enough to provide waveguiding within the organic film. Also, whereas a thickness of 3000 Å is optimal for single-mode propagation within the $Alq_3$/DCM film, higher-order modes can be supported by correspondingly thicker films.

The formation of optically smooth, sharp facets 12*a* and 12*b* at opposing edges of the device 10 is a natural advantage of vacuum-deposited films. The shape of the facets 12*a* and 12*b* will follow the shape of the corresponding facets of the underlying substrate 11. As such, it is important that the facets of the substrate 11 be smooth and parallel to each other. The above-described process provides a technique for fabricating optical cavities without additional processing. By such means, facet reflectivities of 7% are obtained, which is sufficient to provide the necessary optical feedback. Furthermore, as is known, optical feedback can be achieved with other structures as well, such as by an optical grating placed underneath the optically pumped region of the organic film, thereby forming a distributed feedback structure, if the grating blaze separation is $m\lambda/2nc$, where m=1, 2, . . .

In the alternative, the film 12 can be deposited :)n the substrate 11 and the combination then cleaved to form smooth, sharp facets.

The device 10 of the present invention can be optically pumped using any light source emitting light of sufficient intensity which can be absorbed by the host material molecular species. In the exemplary embodiment of FIG. 1, the device 10 is optically pumped using a nitrogen laser 21 which generates 500 psec pulses with a wavelength of 337 nm at a 50 Hz repetition rate. As shown in FIG. 1, the pump beam is focused, such as by a cylindrical lens 22, into a 100 $\mu$m wide stripe 23 on the film surface oriented orthogonal to the facets 12*a* and 12*b* of the device. The refractive index of the illuminated portion of the organic film 12 is higher than that of the non-illuminated portion, thereby providing confinement of the optical mode in the vertical direction. This is the gain-guiding effect referred to above.

A laser beam 24 is emitted from a facet 12*a* and/or 12*b* of the device 10. A typical length for R device in accordance with the present invention is 25 mm, although devices of shorter length, e.g., 0.5 mm, can be implemented.

Although the reflectivity of the edge facets is small, this is compensated for by the comparatively large cavity length, thereby reducing effective optical losses to approximately 1 $cm^{-1}$ (neglecting waveguide losses).

Because the material is essentially transparent to DCM red emission, it is not necessary to pump the whole length of the optical cavity to achieve lasing action. Optical gain in the $Alq_3$/DCM film is so high that lasing can be achieved, for instance, by pumping the film of a 25 mm long device over only 1 mm of the device's length. However, pumping the device over a larger portion of its length, e.g. 20 mm, allows for lower threshold powers.

Figure 2:
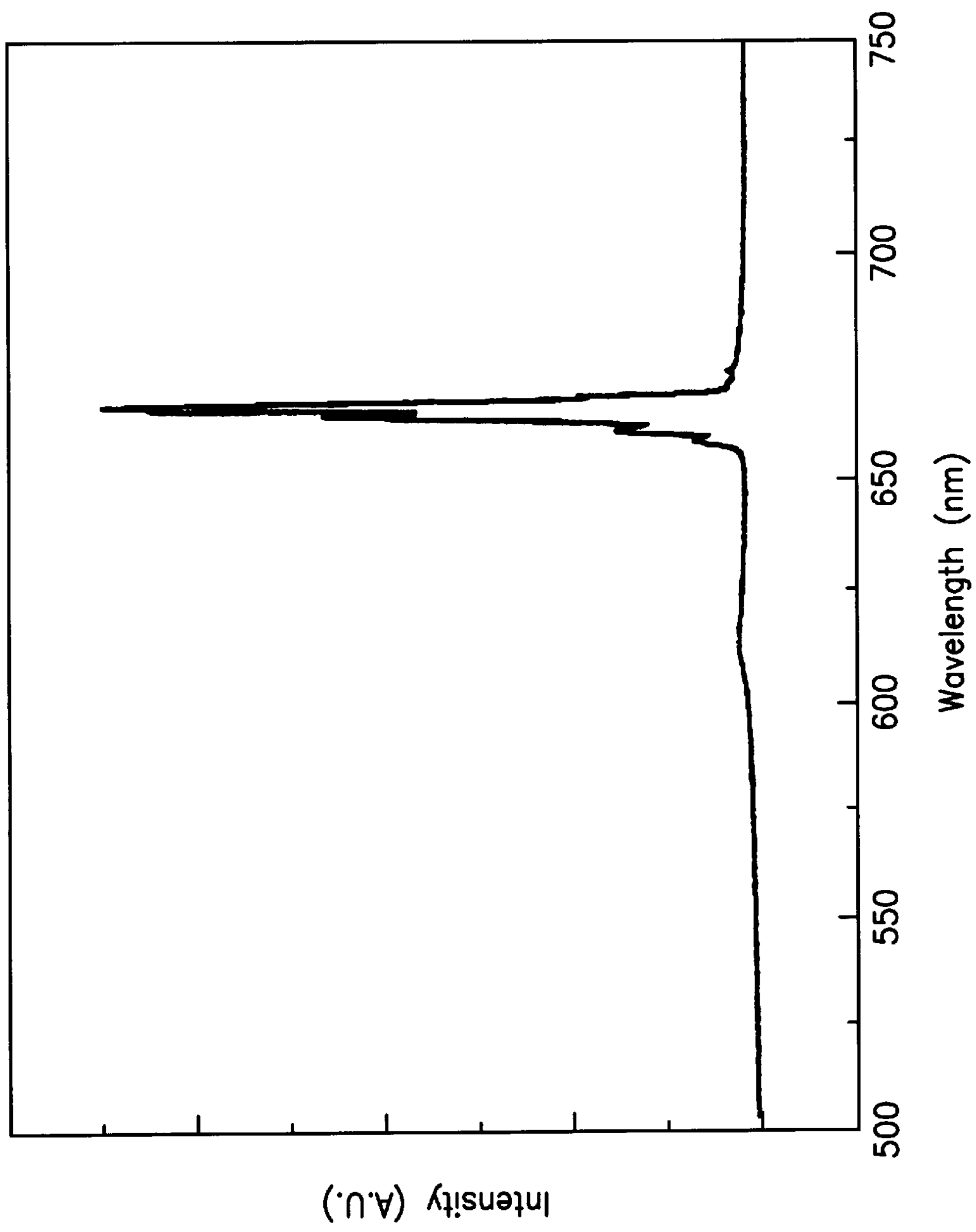
FIG. 2 shows the spectrum of the edge emission from a device in accordance with the present invention.

The edge emission spectrum of the device of the present invention can be analyzed by a spectrograph and a CCD camera. FIG. 2 shows the spectrum of the edge emission from a device in accordance with the present invention. The spectrum of FIG. 2 was exhibited at a pump energy density of 15 $\mu J/cm^2$, which is approximately 10 times the lasing threshold of the device.

Figures 3, 3A:
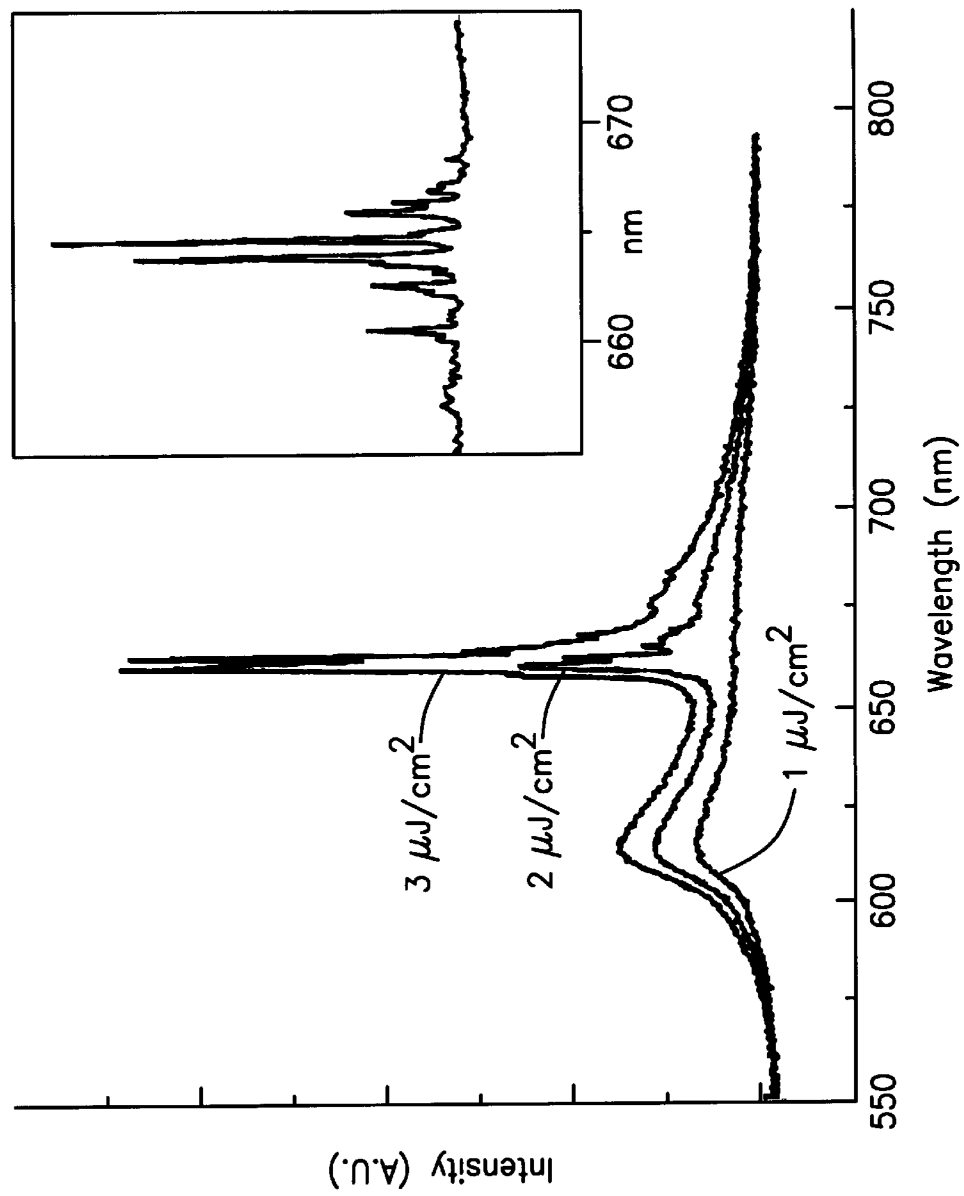
FIGS. 3 and 3A show spectra of the edge emission from a device in accordance with the present invention at different excitation levels near the lasing threshold.

FIG. 3 shows how the emission spectrum of the device of FIG. 1 varies as the pump energy density varies near the 1.5 $\mu J/cm^2$ lasing threshold of the device. Below the threshold, the edge emission spectrum is dominated by a broad peak centered at a wavelength of 620 nm. This peak is characteristic of spontaneous emission from DCM. No emission from the $Alq_3$ is seen under any of the pump intensities, thus indicating complete energy transfer between the $Alq_3$ host and the DCM. Laser emission appears as a sharp peak on the long wavelength side of the photoluminescence spectrum at pump energy densities as low as 1.5 $\mu J/cm^2$. Edge emission spectra are completely dominated by laser peaks at high excitation levels (i.e., above 5 $\mu J/cm^2$, as in the spectrum shown in FIG. 2).

FIG. 3A shows a high resolution edge emission spectrum of the device of FIG. 1 at a pump level of 1.7 $\mu J/cm^2$. The spectrum of FIG. 3A reveals a set of longitudinal lasing modes. A mode competition process is clearly indicated by the irregular spacing of these modes. The spectral width of the peaks is limited by the resolution of the spectrograph. (The separate longitudinal modes of a 25 mm long optical cavity are expected to have a wavelength spacing of 0.04 Å, which is well below the 1 Å resolution limit of a typical spectrograph.)

Figure 4:
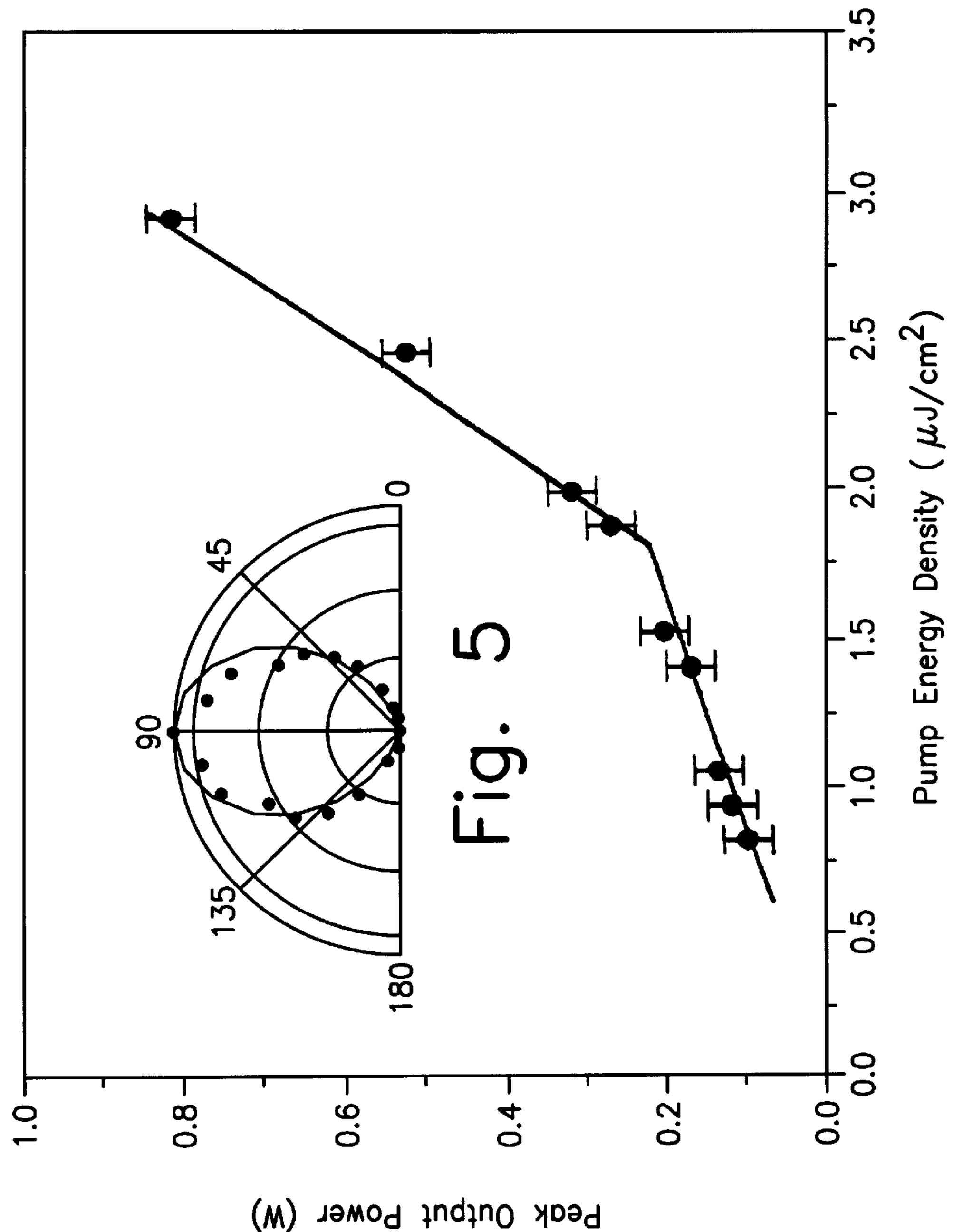
FIG. 4 shows, for a device in accordance with the present invention, the dependence of the output emission intensity on the input pump energy density near the lasing threshold of the device.

FIG. 4 shows the dependence of the device's peak output power to the pump energy density. From this relationship, the lasing threshold can be clearly discerned. Each line segment in the graph of FIG. 4 is a linear fit to empirically measured points. The slopes of the two line segments emphasize a change in differential quantum efficiency, from 0.2%, below the lasing threshold, to 10% above the lasing threshold. It is to be noted, however, that measured differential quantum efficiencies represent a considerable underestimation since the lasing region in an optically pumped gain-guided device is only a small fraction of the material which is being pumped. Hence, most of the pump power is lost in non-lasing regions. The differential quantum efficiency decreases to 7% at excitation levels above 10 $\mu J/cm^2$ (not shown), corresponding to peak output powers exceeding 4 W.

FIG. 5 shows the intensity of laser emission passing through a polarizer as a function of angle between the plane orthogonal to the film surface and the plane of the polarizer. The emission is strongly linearly polarized, as is expected for laser emission. The degree of polarization measured is 15 dB, although it should be noted that this result is limited by the measurement arrangement. The solid line, which is a fit of the empirically measured points, follows $\sin^2(\alpha)$, where $\alpha$ is the polarizer angle.

With the exemplary embodiment of FIG. 1, bright red laser emission is clearly visible from the edge of the device. Diffraction of the output beam is faintly observed. The output laser beam includes several transverse modes which diverge in the direction orthogonal to the device surface. The peak intensity of the red laser emission at the output facets is $10^8$ $W/cm^2$ (corresponding to a measured peak power exceeding 30 W) at a pump level of 200 $\mu J/cm^2$.

All experiments and empirical measurements described above were conducted under a dry nitrogen atmosphere. No degradation of the $Alq_3$/DCM film of the device of the present invention was observed after several hours of operation (which corresponds to at least $10^6$ laser pulses). This indicates that the $Alq_3$/DCM thin film enjoys a high degree of photochemical stability and that it is well suited for use in electrically pumped organic lasers.

Furthermore, the very low lasing threshold of the device of the present invention is also a significant advantage over known devices. Assuming a carrier lifetime of 10 ns for $Alq_3$ and DCM, a lasing threshold energy density of 1.5 $\mu J/cm^2$ implies a 10–50 $A/cm^2$ threshold current density for pulsed electrical injection, assuming that only 25% of electrically injected carriers form singlet excitations. The lasing threshold can be reduced even further by controlling the doping concentration and increasing the facet reflectivities, both of which are factors affecting the efficiency of the laser device.

The device of the present invention also overcomes the problems related to quenching processes in small-molecule organic materials. Such quenching processes are observed at high carrier densities and lead to decreased photoluminescence quantum efficiency. It has been found that, due to bimolecular reactions, the quantum efficiency of photoluminescence of $Alq_3$ films begins to decrease at incident intensities above $10^{14}$ photons/$cm^2$. The device of the present invention, however, has a lasing threshold which is at pump intensities of only approximately $10^{12}$ photons/$cm^2$, leaving a substantial margin for increasing pump intensities without encountering a decrease in efficiency due to bimolecular recombination.

FIG. 6A shows a further embodiment of an optically-pumped laser in accordance with the present invention. In this embodiment, an additional layer 13 is provided between the substrate 11 and the organic active layer 12. The layer 13 has an index of refraction lower than that of the organic layer 12 and serves to increase optical confinement in the active layer in the direction normal to the surface of the device.

FIG. 6B shows yet another embodiment of an optically-pumped laser in accordance with the present invention. In this embodiment, the layer 13 is deposited on a ridge-patterned substrate. In this case, the layer 13 forms a ridge on top of the substrate 11 on which the active organic layer 12 is deposited. In this embodiment, the optical mode is confined in both the z-direction as well as in the y-direction. The width of the layers 12 and 13 should preferably be narrow enough to support only a single lateral optical mode (e.g., 1–10 $\mu m$). The thickness of the active organic layer 12 should be approximately equal to the reciprocal of the absorption coefficient of the host material at the wavelength of the light with which the device is pumped. If a reflective layer (not shown) is placed between the layer 13 and the substrate 11, the thickness of the organic layer 12 should be approximately half the reciprocal of the absorption coefficient of the host material at the wavelength of the light with which the device is pumped. To protect the laser device of FIG. 6B, the device can be overcoated with a transparent material (not shown) whose index of refraction is lower than that of the active organic layer 12.

In addition to the optically-pumped embodiments discussed above, the present invention also provides an electrically-pumped organic semiconductor laser.

Figure 7A:
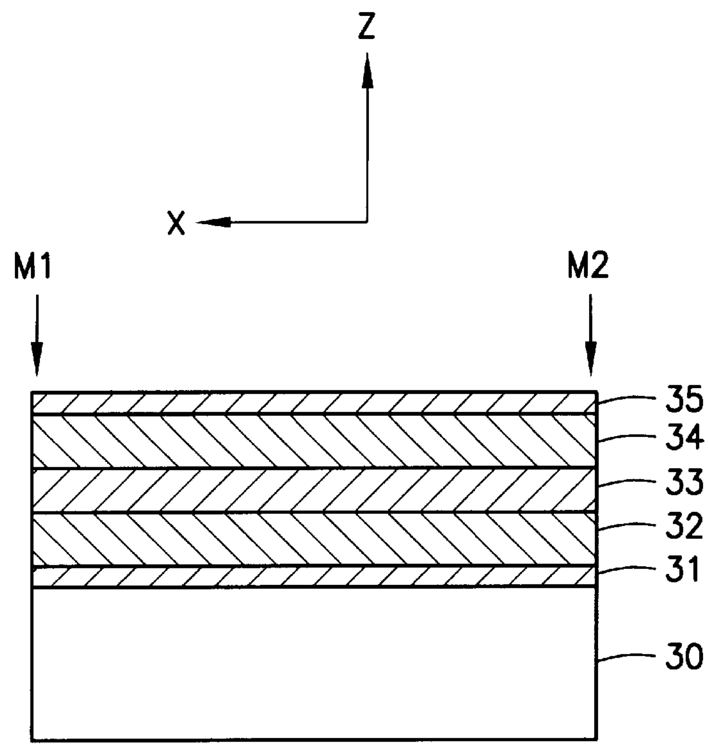
FIGS. 7A and 7B show embodiments of electrically-pumped laser devices in accordance with the present invention.

FIG. 7A shows an embodiment of an electrically-pumped laser device in accordance with the present invention. A bottom electrode 31, a bottom cladding layer 32, an organic active layer 33, a top cladding layer 34 and a top electrode 35 are deposited, in sequence, over a substrate 30. The optical confinement in the active layer 33 depends on the indices of refraction of the cladding layers 32 and 34.

As in the case of the optically-pumped laser device, the active layer 33 can be composed of $Alq_3$/DCM. Either one of the cladding layers is composed of a hole conducting material, such as $MgF_2$ doped with TPD. To get good hole mobility, a 10% concentration of TPD will suffice. The other one of the cladding layers is composed of an electron conducting material, such as $Alq_3$ or $MgF_2$ doped with $Alq_3$. For either cladding layer 32 or 34, the $MgF_2$ can be replaced with another alkali halide such as LiF, KF or KI or with a transparent, low index of refraction, conducting organic material. Electrons and holes are injected into the active layer 33 where the energy is transferred from the conducting host material to the dopant molecules, which emit light.

An optical resonator is formed by the edges of the film, i.e., mirror facets M1 and M2. At least one of the electrodes 31 and 35 is patterned into a stripe oriented in the x-direction. That portion of the active material which is electrically pumped experiences a change in optical gain, thus forming a waveguide in the lateral direction (i.e., the gain-guiding effect).

In the electrically-pumped laser device of the present invention, the index of refraction of the active layer 33 must be higher than that of the cladding layers 32 and 34. This ensures that most of the mode overlaps with the gain layer. Preferably, the indices of refraction of the cladding layers 32 and 34 should be substantially equal to provide optimal optical confinement.

The cladding layers 32 and 34 should be thick enough to substantially prevent absorption of the optical mode at the electrodes 31 and 35 and to allow for efficient current injection. The thicknesses of the cladding layers can be determined in a known manner. For single-mode operation, the thickness of the active layer 33 should be substantially equal to the lasing wavelength divided by twice the index of refraction of the active layer. For higher modes, the thickness of the active layer 33 should be accordingly greater.

Optical confinement can also be achieved by photobleaching the active layer 33 to define a waveguide in the active layer. Using this technique, once the active layer 33 has been deposited, a photomask is applied which partially covers the active layer 33 and the layer is exposed to intense UV light in an $O_2$ environment. The unmasked portions of the active layer 33 are thus bleached, lowering their index of refraction. The masked portion of the active layer 33 retains its original, higher index of refraction and is thus optically confined in a lateral direction.

Optical confinement can also be achieved by patterning the substrate or bottom cladding layer to achieve index guiding (similar to the optically-pumped embodiment of FIG. 6B). For example, photo-bleaching can be used on the bottom cladding layer 32 to create an index modulated distributed Bragg reflector under the active layer 33.

An optical resonator can also be formed in the z-direction. In this case, the top and bottom electrodes also serve as optical mirrors, or, if the electrodes are transparent to light, high reflectivity mirrors can be added on both sides of the structure. The maximum of the optical mode of this structure should spatially match the position of the optical layer. Furthermore, the wavelength of the optical mode should overlap with the gain spectrum of the dopant molecule.

Figure 7B:
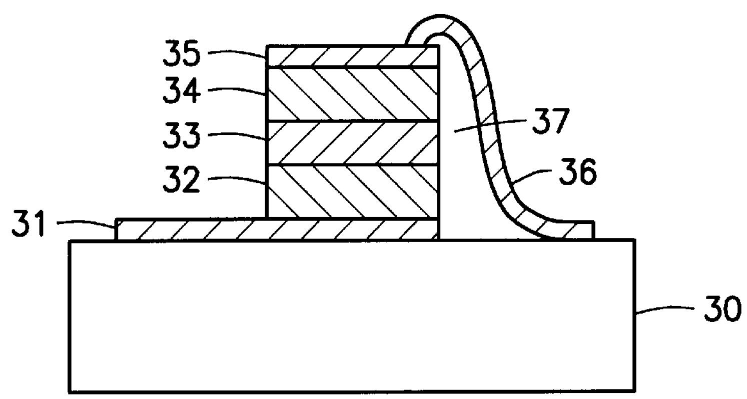

FIG. 7B shows a further embodiment of an electrically-pumped laser device in accordance with the present invention. In this embodiment, the bottom electrode 31 extends beyond the laser structure so as to provide a contact surface. Additionally, an insulator 37 is provided on a side of the laser structure and a contact 36 extending from the upper electrode 35 to the surface of the substrate 30 is deposited on the insulator.

The present invention was developed with funding provided, in part, by the Air Force Office of Scientific Research and by the National Science Foundation.

The subject invention as disclosed herein may be used in conjunction with co-pending applications: "High Reliability, High Efficiency, Integratable Organic Light Emitting Devices and Methods of Producing Same," Ser. No. 08/774,119 (filed Dec. 23, 1996), for which the Issue Fee was paid on Sep. 23, 1999; "Novel Materials for Multicolor LED's, Ser. No. 08/850,264, " Attorney Docket No. 10020/24 (filed May 2, 1997), Ser. No. 08/850,264, for which the Issue Fee was paid on Jan. 21, 2000; "Electron Transporting and Light Emitting Layers Based on Organic Free Radicals," Ser. No. 08/774,120 (filed Dec. 23, 1996), now U.S. Pat. No. 5,822,833; "Multicolor Display Devices,"Ser. No. 08/772,333 (filed Dec. 23, 1996), now U.S. Pat. No. 6,013,982; "Red-Emitting Organic Light Emitting Devices (LED's)," Ser. No. 08/774,087 (filed Dec. 23, 1996), for which the Issue Fee was paid on Jul. 21, 1999; "Driving Circuit For Stacked Organic Light Emitting Devices,"Ser. No. 08/792,050 (filed Feb. 3, 1997), now U.S. Pat. No. 5,757,139; "High Efficiency Organic Light Emitting Device Structures," Ser. No. 08/772,332 (filed Dec. 23, 1996), now U.S. Pat. No. 5,834,893; "Vacuum Deposited, Non-Polymeric Flexible Organic Light Emitting Devices," Ser. No. 08/789,319 (filed Jan. 23, 1997), now U.S. Pat. No. 5,844,363; "Displays Having Mesa. Pixel Configuration," Ser. No. 08/794,595 (filed Feb. 3, 1997); "Stacked Organic Light Emitting Devices," Ser. No. 08/792,046 (filed Feb. 3, 1997), now U.S. Pat. No. 5,917,280; "High Contrast Transparent Organic Light Emitting Device Display," Ser. No. 08/821,380 (filed Mar. 20, 1997), now U.S. Pat. No. 5,986,401; "Organic Light Emitting Devices Containing A Metal Complex of 5-Hydroxy-Quinoxaline as A Host Material, Ser. No. 08/838,099" Attorney Docket No. 10020/21 (filed Apr. 14, 1997), Ser. No. 08/838,099, now U.S. Pat. No. 5,861,219 and "Light Emitting Devices Having High Brightness, Ser. No. 08/844,353" Attorney9 Docket No. 10020/16 (filed Apr. 18, 1997) Ser. No. 08/844,353, which has been allowed, each co-pending application being incorporated herein by reference in its entirety. The subject invention may also be used in conjunction with the subject matter of each of co-pending U.S. patent application Ser. Nos. 08/354,674, now U.S. Pat. No. 5,707,745, 08/613,207, now U.S. Pat. No. 5,703,436, 08/632,322 now U.S. Pat. No. 5,757,026, and 08/693,359 and provisional patent application Ser. Nos. 60/010,013 which was coneverted to a regular application and is now U.S. Pat. No. 5,986,268. 60/024,001 which was converted to a regular U.S. Pat. No. 5,844,363; and 60/025501 which was converted to a regular U.S. application Ser. No. 08/844,353, which has been allowed, each of which is also incorporated herein by reference in its entirety.

What is claimed is:

1. A laser comprising:

a substrate; and a layer of thin film organic material arranged on the substrate wherein the organic material has an index of refraction greater than an index of refraction of the substrate, and the organic material lases when pumped to thereby produce laser light.

2. The laser of claim 1, wherein the organic material includes a photoluminescent organic material doped with a laser dye.

3. The laser of claim 1, wherein the organic material is applied onto the substrate by vacuum deposition.

4. The laser of claim 2, wherein the photoluminescent organic material includes tris(8-hydroxyquinoline) aluminum ($Alq_3$).

5. The laser of claim 2, wherein the laser dye includes DCM.

6. The laser of claim 1, wherein the organic material includes a host material doped with a guest material, and wherein an electroluminescent spectrum of the host material and an absorption spectrum of the guest material overlap.

7. The laser of claim 1, wherein the organic material includes a host material doped with a guest material, and wherein energy absorbed by the host material is transferred to the guest material.

8. The laser of claim 1, wherein the substrate includes glass.

9. The laser of claim 1, wherein the layer of organic material includes two reflective facets substantially parallel to each other, thereby forming an optical resonator.

10. A laser comprising:

a substrate;

a first electrode arranged on the substrate;

a first cladding layer arranged on the first electrode;

an active organic layer arranged on the first cladding layer;

a second cladding layer arranged on the active organic layer; and a second electrode arranged on the second cladding layer.

11. The laser of claim 10, wherein the active organic layer includes a photoluminescent organic material doped with a laser dye.

12. The laser of claim 10, wherein the first cladding layer includes a hole conducting material and the second cladding layer includes an electron conducting material.

13. The laser of claim 10, wherein the first cladding layer includes an electron conducting material and the second cladding layer includes a hole conducting material.

14. The laser of claim 10, wherein the active organic layer has an index of refraction greater than an index of refraction of the first cladding layer and greater than an index of refraction of the second cladding layer.

15. The laser of claim 14, wherein the active organic layer includes a photoluminescent organic material doped with a laser dye.

16. The laser of claim 15, wherein the photoluminescent organic material includes tris(8-hydroxyquinoline) aluminum ($Alq_3$).

17. The laser of claim 15., wherein the laser dye includes DCM.

18. The laser of claim 10, wherein the active organic layer includes a host material doped with a guest material, and wherein an electroluminescent spectrum of the host material and an absorption spectrum of the guest material overlap.

19. The laser of claim 10, wherein the active organic layer includes a host material doped with a guest material, and wherein energy absorbed by the host material is transferred to the guest material.

20. The laser of claim 10, wherein the substrate includes glass.

21. The laser of claim 10, wherein the active organic layer includes two reflective facets substantially parallel to each other, thereby forming an optical resonator.

22. The laser of claim 1, wherein the laser is incorporated into a communications device.

23. The laser of claim 10, wherein the laser is incorporated into a communications device.

24. The laser of claim 1, wherein the laser is incorporated into a printer.

25. The laser of claim 10, wherein the laser is incorporated into a printer.

26. The laser of claim 1, wherein the laser is incorporated into an etching system.

27. The laser of claim 10, wherein the laser is incorporated into an etching system.

28. The laser of claim 1, wherein the laser is incorporated into a measurement device.

29. The laser of claim 10, wherein the laser is incorporated into a measurement device.

30. The laser of claim 1, wherein the laser is incorporated into an optical memory device.

31. The laser of claim 10, wherein the laser is incorporated into an optical memory device.

32. A laser comprising:

a substrate;

a layer of thin film organic material arranged on the substrate; and a light source for optically pumping said organic material;

whereby said organic material lases when pumped with said light source.

33. The laser of claim 32, wherein said organic material comprises tris (8-hydroxyquinoline) aluminum ($Alq_3$).

34. The laser of claim 33, wherein said organic material further comprises a dye comprising DCM.

35. The laser of claim 32, wherein said layer of organic material includes two reflective facets substantially parallel to each other, thereby forming an optical resonator.

36. The laser of claim 1, wherein the organic material comprises small molecules.

37. The laser of claim 1, wherein the organic material consists essentially of small molecules.

38. The laser of claim 10, wherein the active organic layer comprises small molecules.

39. The laser of claim 10, wherein the active organic layer consists essentially of small molecules.

40. The laser of claim 32, wherein the organic material comprises small molecules.

41. The laser of claim 32, wherein the organic material consists essentially of small molecules.

42. A laser comprising a substrate; and a layer of thin film organic material arranged on the substrate, wherein the organic material has an index of refraction greater than an index of refraction of the substrate, and the organic material lases when pumped to thereby produce laser light; and wherein the layer of organic material includes two reflective facets substantially parallel to each other, thereby forming an optical resonator.

43. The laser of claim 42, wherein the organic material includes a photoluminescent organic material doped with a laser dye.

44. The laser of claim 42, wherein the organic material is applied onto the substrate by vacuum deposition.

45. The laser of claim 43, wherein said organic material comprises tris(8-hydroxyquinoline) aluminum ($Alq_3$).

46. The laser of claim 43, wherein the laser dye includes DCM.

47. The laser of claim 42, wherein the organic material includes a host material doped with a guest material, and wherein an electroluminescent spectrum of the host material and an absorption spectrum of the guest material overlap.

48. The laser of claim 42, wherein the organic material includes a host material doped with a guest material, and wherein energy absorbed by the host material is transferred to the guest material.

49. The laser of claim 42, wherein the substrate includes glass.

50. The laser of claim 42, wherein the organic material comprises small molecules.

51. The laser of claim 42, wherein the organic material consists essentially of small molecules.

52. A laser comprising:

a substrate;

a first electrode arranged on the substrate;

a first cladding layer arranged on the first electrode;

an active organic layer arranged on the first cladding layer;

a second cladding layer arranged on the active organic layer; and a second electrode arranged on the second cladding layer;

wherein the active organic layer includes two reflective facets substantially parallel to each other, thereby forming an optical resonator.

53. The laser of claim 52, wherein the active organic layer includes a photoluminescent organic material doped with a laser dye.

54. The laser of claim 52, wherein the first cladding layer includes a hole conducting material and the second cladding layer includes an electron conducting material.

55. The laser of claim 52, wherein the first cladding layer includes an electron conducting material and the second cladding layer includes a hole conducting material.

56. The laser of claim 52, wherein the active organic layer has an index or refraction greater than an index of refraction of the first cladding layer and greater than an index of refraction of the second cladding layer.

57. The laser of claim 56, wherein the active organic layer includes a photoluminescent organic material doped with a laser dye.

58. The laser of claim 57, wherein the photoluminescent organic material includes tris(8-hydroxyquinoline) aluminum ($Alq_3$).

59. The laser of claim 57, wherein the laser dye includes DCM.

60. The laser of claim 52, wherein the active organic layer includes a host material doped with a guest material, and wherein an electroluminescent spectrum of the host material and an absorption spectrum of the guest material overlap.

61. The laser of claim 52, wherein the active organic layer includes a host material doped with a guest material, and wherein energy absorbed by the host material is transferred to the guest material.

62. The laser of claim 52, wherein the substrate includes glass.

63. The laser of claim 52, wherein the active organic layer comprises small molecules.

64. The laser of claim 52, wherein the active organic layer consists essentially of small molecules.

65. The laser of claim 42, wherein the laser is incorporated into a communications device.

66. The laser of claim 52, wherein the laser is incorporated into a communications device.

67. The laser of claim 42, wherein the laser is incorporated into a printer.

68. The laser of claim 52, wherein the laser is incorporated into a printer.

69. The laser of claim 42, wherein the laser is incorporated into an etching system.

70. The laser of claim 52, wherein the laser is incorporated into an etching system.

71. The laser of claim 42, wherein the laser is incorporated into a measurement device.

72. The laser of claim 52, wherein the laser is incorporated into a measurement device.

73. The laser of claim 42, wherein the laser is incorporated into an optical memory device.

74. The laser of claim 52, wherein the laser is incorporated into an optical memory device.

75. A laser comprising:

a substrate;

a layer of thin film organic material arranged on the substrate; and a light source for optically pumping said organic material;

whereby said organic material lases when pumped with said light source;

wherein said layer of organic material includes two reflective facets substantially parallel to each other, thereby forming an optical resonator.

76. The laser of claim 75, wherein said organic material comprises tris(8-hydroxyquinoline) aluminum ($Alq_3$).

77. The laser of claim 75, wherein said organic material further comprises a dye comprising DCM.

78. The laser of claim 75, wherein the organic material comprises small molecules.

79. The laser of claim 75, wherein the organic material consists essentially of small molecules.

* * * * *